·

US005668389A

United States Patent [19]
Jassowski et al.

[11] Patent Number: 5,668,389
[45] Date of Patent: Sep. 16, 1997

[54] OPTIMIZED POWER BUS STRUCTURE

[75] Inventors: Michael Jassowski, Shingle Springs; Keith Smith, Orangevale, both of Calif.

[73] Assignee: Intel Corporation, Santa Clara, Calif.

[21] Appl. No.: 348,570

[22] Filed: Dec. 2, 1994

[51] Int. Cl.$^6$ .................................................. H01L 27/10
[52] U.S. Cl. .................................................. 257/207; 257/691
[58] Field of Search .................................. 257/691, 207, 257/210, 211

[56] References Cited

U.S. PATENT DOCUMENTS

| | | | |
|---|---|---|---|
| 5,119,169 | 6/1992 | Kozono et al. | 257/691 |
| 5,315,130 | 5/1994 | Hively et al. | 257/691 |

*Primary Examiner*—Mahshid D. Saadat
*Assistant Examiner*—S. V. Clark
*Attorney, Agent, or Firm*—Blakely, Sokoloff, Taylor & Zafman

[57] ABSTRACT

An arrangement for providing power to a semiconductor array of cells on a substrate in which the metal 2 power conductors are truncated into short lengths sufficient only to reach between the metal 1 power conductors of adjacent rows of cells, the metal 2 power conductors are placed under the metal 4 power conductors at each side to reduce the current through the metal 3 power conductors, and the metal 3 power conductors are narrowed to the level necessary to carry the reduced current and placed adjacent upper or lower edges of the cells. The arrangement increases the amount of space available for access to the external connection nodes of the devices in the cells of a group on a substrate while reducing the size of the metal overlays necessary to carry power to the cells.

20 Claims, 6 Drawing Sheets

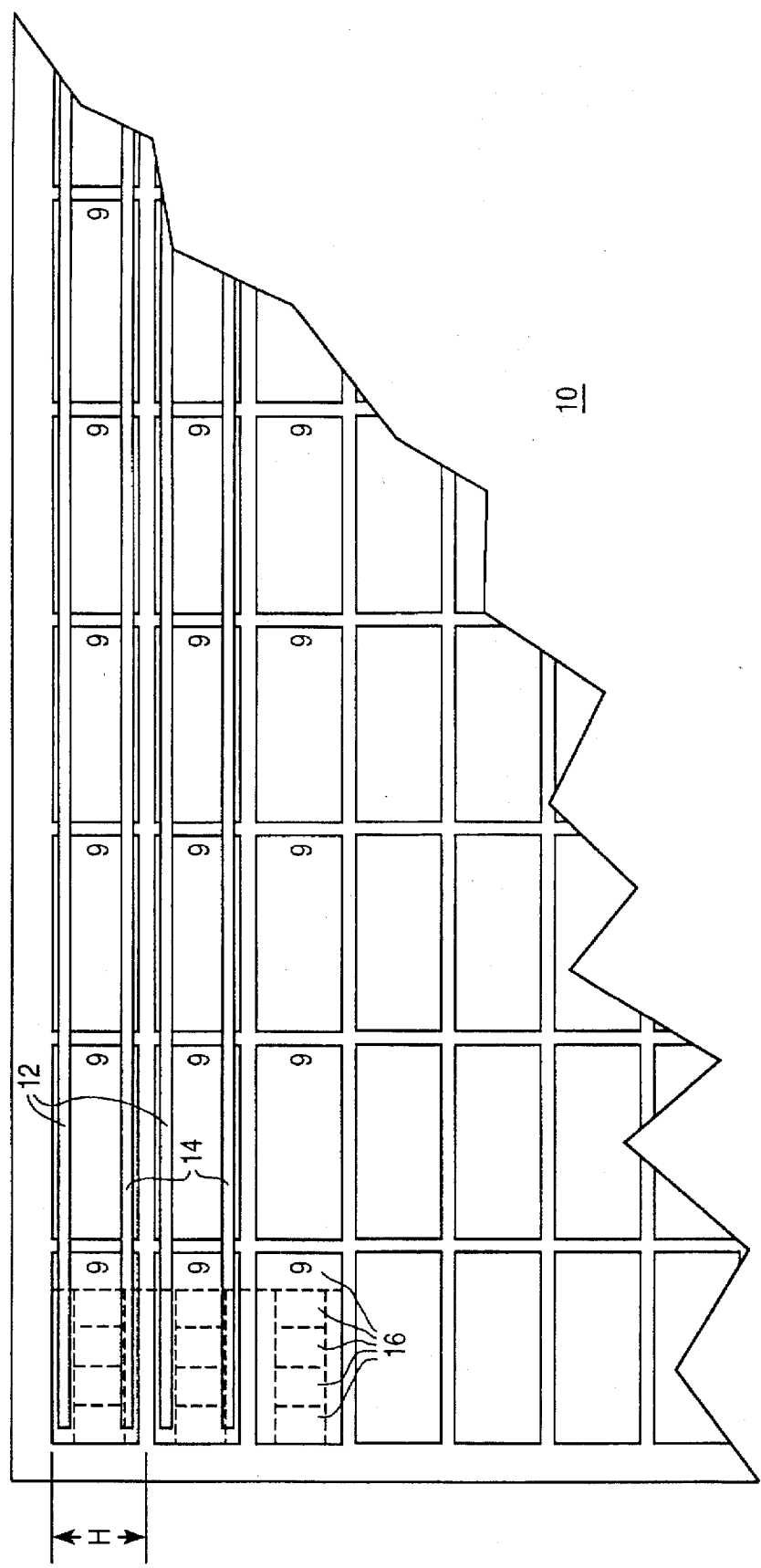
FIG._1 (PRIOR ART)

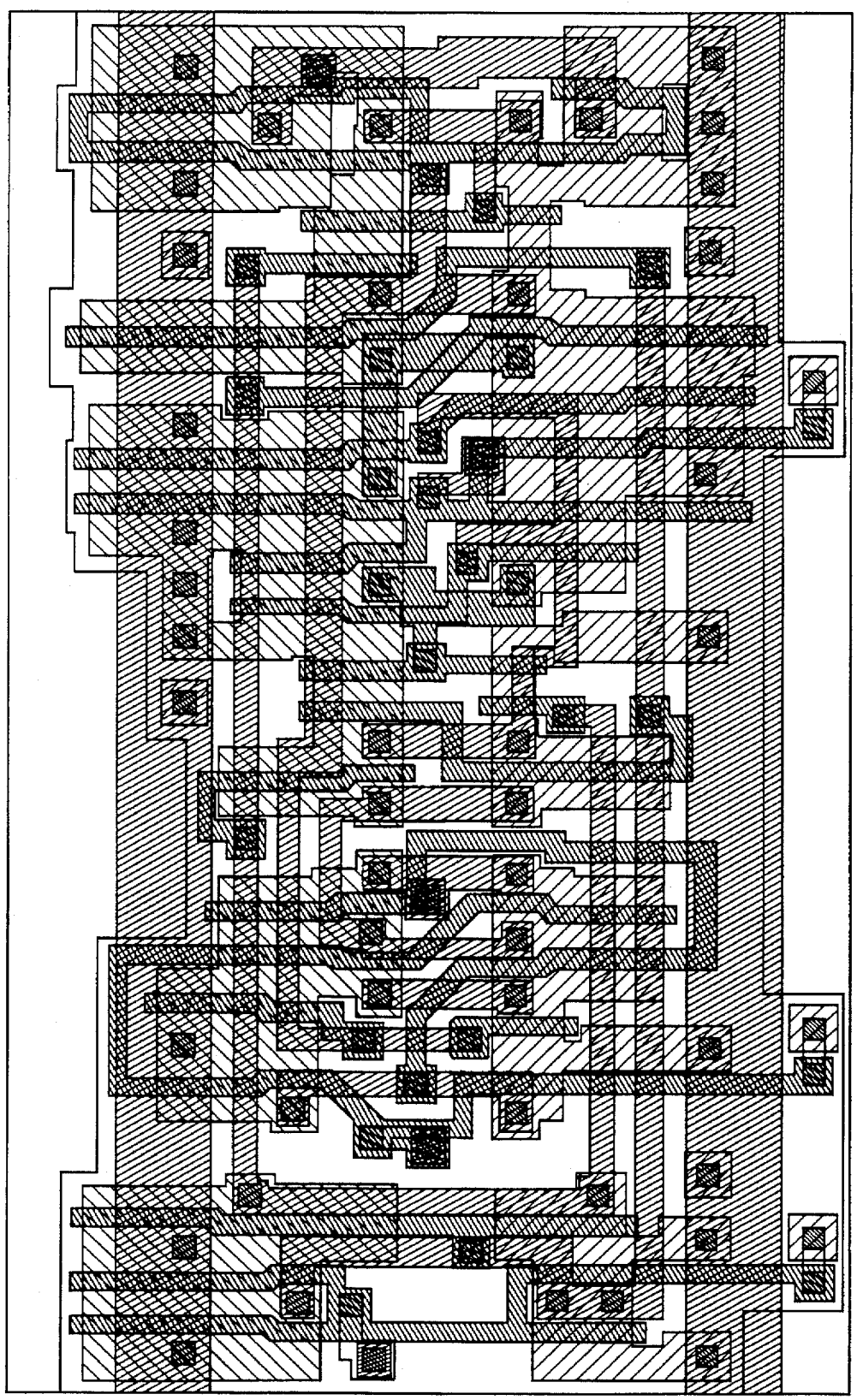
FIG_2

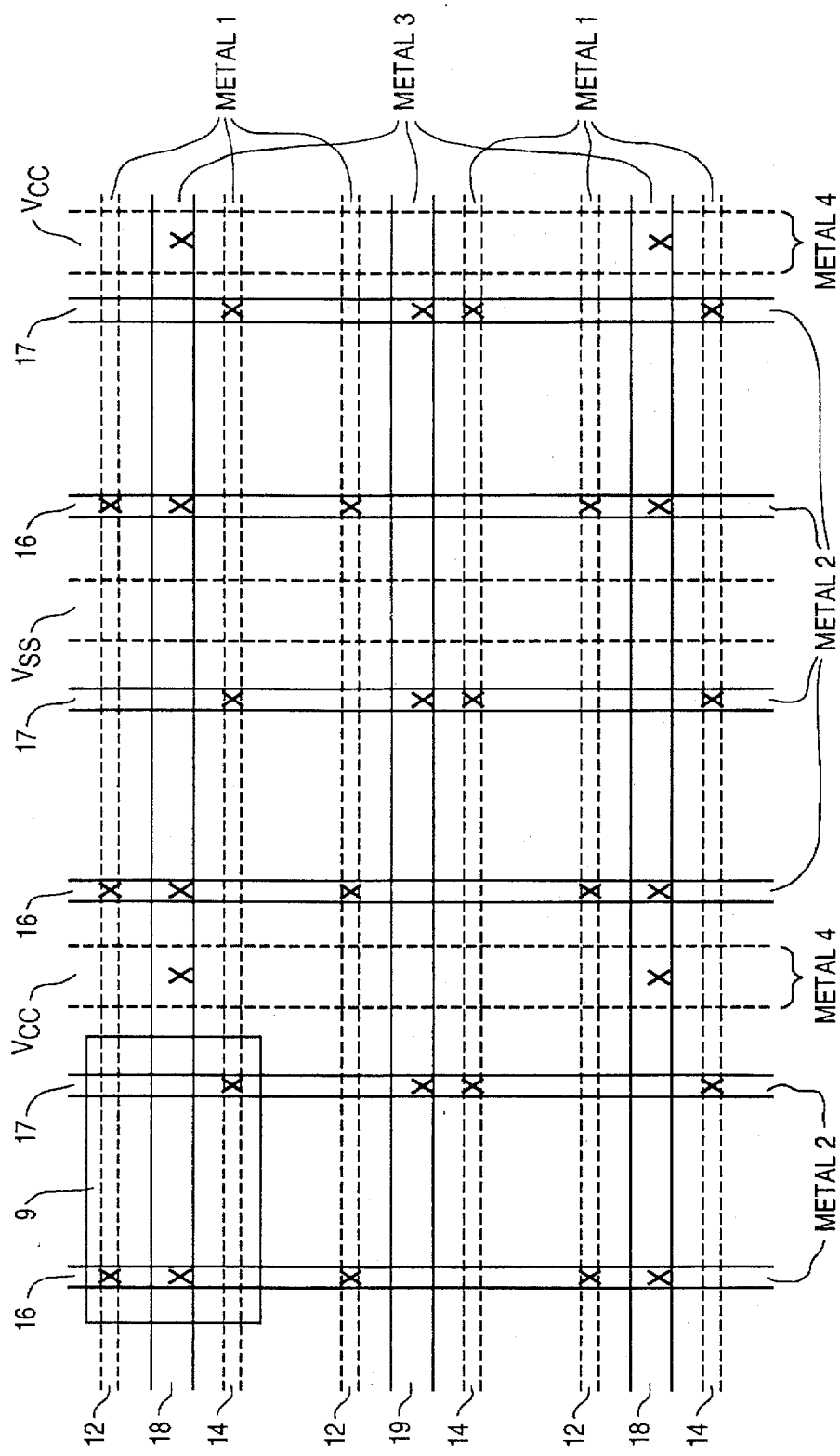
FIG_3 (PRIOR ART)

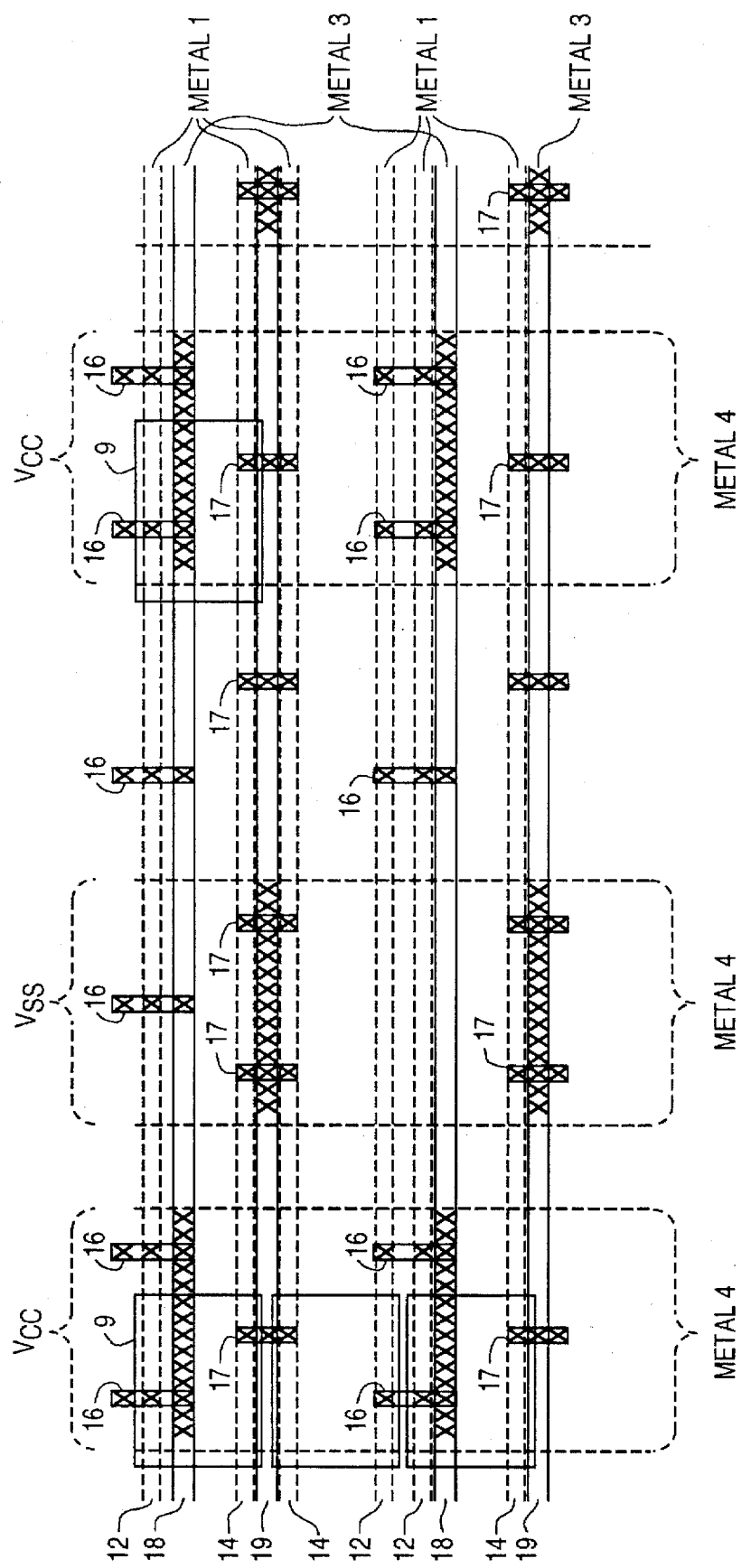
FIG_4

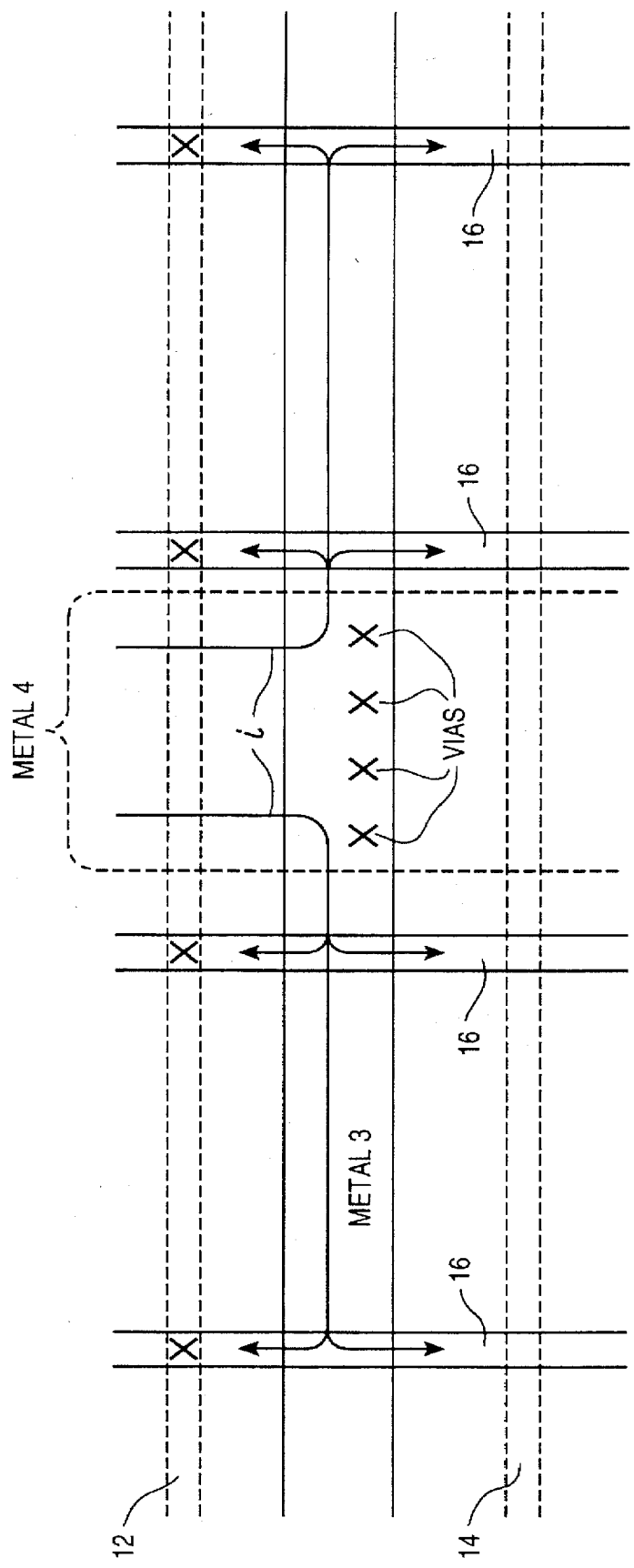

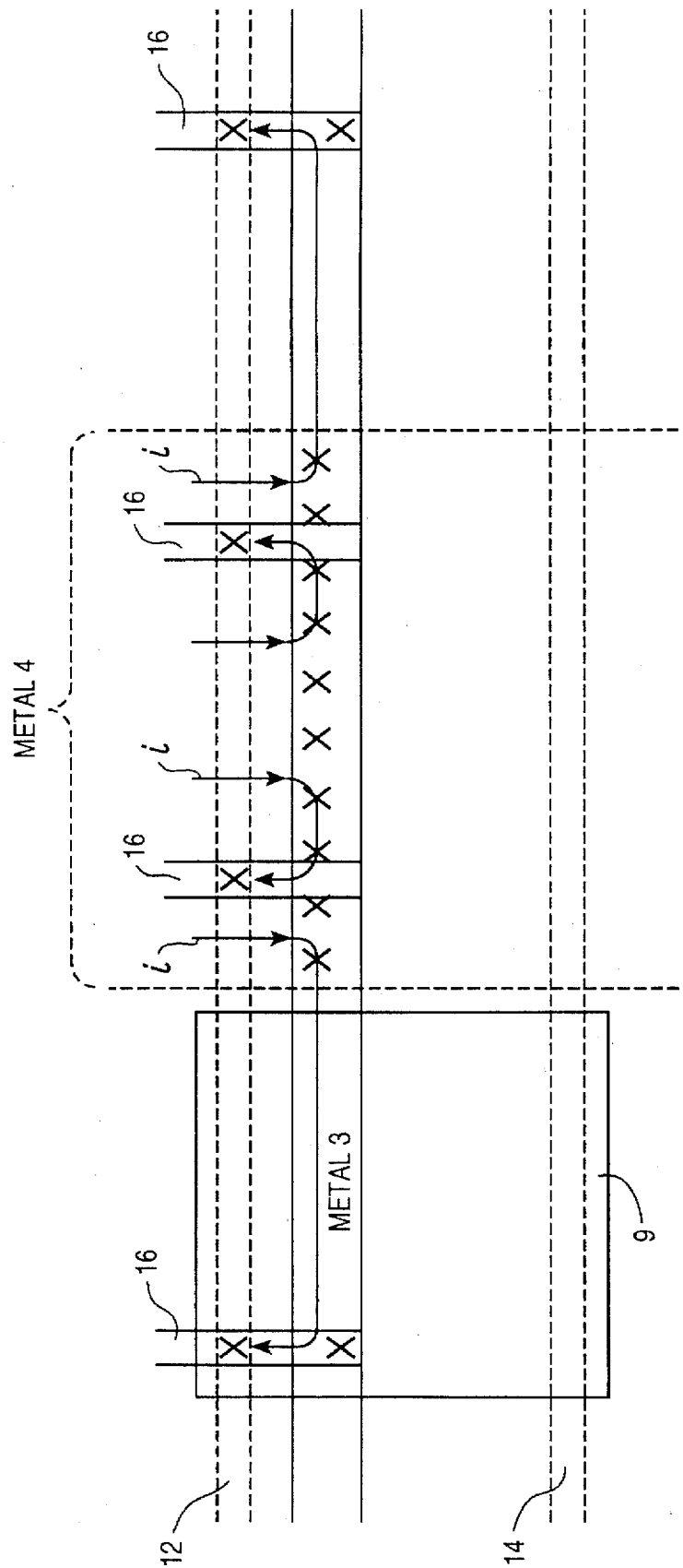
FIG_6

OPTIMIZED POWER BUS STRUCTURE

BACKGROUND OF THE INVENTION

1. Field of the Invention

This invention relates to computer systems, and more particularly, to a new power bus grid structure to be used in the layout of circuits on semiconductor substrates.

2. History of the Prior Art

When semiconductor circuits such as complementary metal-oxide semiconductor (CMOS) circuits are manufactured, the individual devices are laid out on a substrate in essentially rectangular groups of cells. The individual cells of each group are designed to accomplish one particular function in the overall operation of the circuit such as to provide an AND logic function. Each group of cells, on the other hand, is typically designed to accomplish some larger sub-function of the entire circuit on the substrate; for example, one group might function as an address decoder.

The rectangular nature of the groups is determined by the need to conserve die space and to provide power to the devices of the cells through a pair of power buses carrying the voltages generally referred to as Vcc and Vss. In order to place the largest number of cells on a substrate, the two power buses are typically arranged in parallel across the portion of the substrate occupied by the group; and a number of cells are placed side by side and connected to the parallel buses to receive power. These power buses are typically provided by the first metal layer (metal 1) applied to the substrate in producing the devices of the cells. The pattern of parallel buses with connected cells forming a row is repeated by a plurality of similar pairs of metal 1 power buses in additional rows lying parallel to the first row sufficient to provide power to all of the cells of the group. Constraining these cells to fit within the structure provided by the parallel pairs of buses causes the overall pattern of most groups to be rectangular.

In addition to the metal 1 power buses which define the parallel rows for powering the individual cells, some means must be provided for furnishing power to these metal 1 power buses from the upper layers of the semiconductor. Furthermore, the individual cells of the group require interconnections between one another to carry out the functions of the group, connections must be made to other circuitry on the substrate which mounts the entire circuit, and the individual devices in each cell must be appropriately interconnected. These interconnections are typically accomplished by conductors of the metal 1 layer. The interconnections to provide power to the power buses of the metal 1 layer of the group are typically provided by parallel metallic conductors of a second metal layer (metal 2) which form a pattern at right angles to and on top of the power conductors of the metal 1 layer described above. These metal 2 conductors connect to the power buses of the metal 1 layer. In turn, connections to the power providing conductors of the metal 2 layer are typically provided by metallic conductors of a third metal layer (metal 3) which run parallel to one another and to the power conductors of the metal 1 layer. In more advanced circuits such as those manufactured using a 0.5 micron process, a fourth layer of metal conductors (metal 4) lies parallel to the conductors of the metal 2 layer over all of the other layers of power conductors and provides connections to the main power sources. All of these metallic power conductors are variously connected to one another to provide power to all of the devices of all of the cells.

In addition to carrying power to the devices of the cells metal conductors provide, the various interconnections between the cells by which signals are transferred. As has been pointed out, most of the connections within a cell are made by conductors in the metal 1 layer. However, each of the metal 2 and metal 3 layers are also used to interconnect the cells and provide the signals appropriate to the circuit functions which the cells carry out.

As the circuitry placed on a semiconductor substrate becomes smaller in size and more complicated, it becomes more difficult to make the connections to the devices within a cell which must be connected to other cells and other circuitry. This occurs because there are more devices; the area allotted to each cell is smaller; there are more metallic signal conductors interconnecting the devices on the metal 1 layer leaving little room to access the connection nodes; and the power conductors of the metal 1, metal 2, metal 3, and metal 4 layers cover more of the area used by the devices within the cell so that nodes to which connections may be made are often covered and inaccessible.

It is desirable to provide a power busing arrangement which provides better access to nodes of the devices on a semiconductor substrate than do arrangements known to the prior art.

SUMMARY OF THE INVENTION

The objects of the present invention are realized in a power busing grid in which the metal 2 power conductors are truncated into shorter lengths sufficient only to reach between the metal 1 power conductors of adjacent rows of cells, the metal 3 power conductors are moved close to one edge of the cells so that metal 2 conductors need extend over a significant portion of the cells, the metal 2 power conductors are placed under the metal 4 power conductors at each side thereof to reduce the current through the metal 3 power conductors, and the metal 3 power conductors are narrowed to the width necessary to carry the reduced current. The combination of these variations from prior art arrangements increases the amount of space available for access to the external connection nodes of the devices within each of the cells of a group on a substrate while reducing the size of the metal overlays necessary to carry power to the cells.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a block diagram of a group of cells positioned on a silicon or similar substrate in accordance with the teachings of the prior art.

FIG. 2 is a block diagram of a portion of a single CMOS cell placed on a silicon or similar substrate.

FIG. 3 is a diagram illustrating the layers of metallic conductors used to supply power to semiconductor circuits in accordance with the prior art.

FIG. 4 is a diagram illustrating the layers of metallic conductors used to supply power to semiconductor circuits in accordance with the present invention.

FIG. 5 is a diagram illustrating the flow of current through the various layers of metallic conductors used to supply power to semiconductor circuits in accordance with the prior art.

FIG. 6 is a diagram illustrating the flow of current through the various layers of metallic conductors used to supply power to semiconductor circuits in accordance with the present invention.

DETAILED DESCRIPTION

Referring now to FIG. 1, there is illustrated an arrangement of cells 9 on a semiconductor substrate or chip 10. The chip 10 may be designed in accordance with a number of well known processes to include a plurality of individual cells on a semiconductor die. Typically, the individual cells are each designed to accomplish a limited logic function and are comprised of interconnected semiconductor devices such as transistors. The cells may be standard cells designed to be utilized repeatedly to provide the standard functions used in implementing larger circuits such as central processing units (CPUs) and application specific integrated circuits (ASICs). The cells may also be non-standard cells utilized for a particular purpose unique to the larger circuit.

The individual ones of these cells 9 are positioned in rows on the layout of what is the semiconductor chip 10. The positions of these rows are essentially defined by the separation of large metallic power buses 12 and 14 positioned parallel to one another running over the face of the chip 10. Such metallic conductors are typically a part of the first metallic layer (referred to as metal 1) of conductors on the chip 10. These buses 12 and 14 are the large current carrying conductors used to supply power directly to all of the individual devices within the cells 9 in one row on the semiconductor chip 10. These buses 12 and 14 are a part of a larger metallic grid of power connections which furnishes power to all of the cells 9 in one circuit group on the chip 10. All the cells 9 in a horizontal row fit within a fixed height H (shown in the figure) of a row determined by the height of the tallest cell in the row. The conductors 12 and 14 carry the voltages Vcc and Vss for the associated cells in that row. Typically, one of these conductors 12 may be positioned toward the top of the row to provide the voltage Vcc to all of the devices in each cell of the row; and the other conductor 14 may be positioned toward the bottom of the row to provide the voltage Vss to all of the devices in each cell of the row.

FIG. 2 illustrates a portion of an exemplary cell 9. The cell 9 is a typical cell of semiconductor devices which may be positioned on a semiconductor substrate as a portion of a group of cells which provide some larger circuit function. The individual cells 9 in each row are each aligned to utilize these power buses so that the power buses 12 and 14 lie within but near to the boundaries of all of the typical cells 9. Once the cells 9 and all other portions of the larger circuit have been laid out, connections are provided between the individual cells 9 and other circuit elements which are carried on the particular substrate.

As may be seen in FIG. 2, a single cell 9 includes a number of individual transistor devices created by diffusion of N and P impurities into the substrate, the power conductors 12 and 14, and a series of metallic and polysilicon conductive paths 15 for applying power to the various devices. A great deal of the surface of the cell is covered with these conductive paths 15. In fact, so much of the internal portion of the cell surface is covered by conductive paths that there is very little space for connections to be made to nodes of the cell which must be connected to external circuitry in order for the cell 9 and the circuitry of the group of which it is a part to function correctly. Certain of these nodes are delineated by the letter N provided on the conductive paths 15 illustrated in FIG. 2. As may be seen, certain nodes in the figure are surrounded on three sides by conductors and are, therefore, accessible by a metal 1 layer conductor only by sinuous paths left open between the conductive paths 15. On the other hand, the nodes labeled N1, N2, and N3 may only be reached from directly above the metal 1 layer since each is surrounded by metal 1 conductive paths on all sides.

If this were all of the metal and other conductors applied to the circuitry of the cell of FIG. 2, it would be possible to apply metallic conductors which might reach the nodes N1, N2, and N3. For example, the node N3 may be reached by a conductive path from directly above in the next layer of conductors (metal 2) which are not shown in FIG. 2. However, it is also necessary to provide metallic conductive paths to carry the voltages Vcc and Vss from outside the cell 9 to the metal 1 conductors 12 and 14 and the devices within the cell 9. In a typical prior art semiconductor circuit, this is accomplished as is illustrated in FIG. 3 by a grid of additional metallic conductors including a second layer of metallic conductors (metal 2) applied over the top of the metal 1 layer of conductors at right angles thereto, a third layer of metallic conductors (metal 3) applied over the top of the metal 2 layer of conductors at right angles thereto, and (in advanced circuit processes) a fourth layer of metallic conductors (metal 4) applied over the top of the metal 1 layer of conductors at right angles thereto.

The metal 2 conductors for carrying Vcc and Vss typically run at right angles to the conductors 12 and 14 and are repeated at even intervals so that two metal 2 conductors 16 and 17 cross each cell 9. One group of these conductors 16 is connected to all of the conductors 12 of each row while the other group of conductors 17 is connected to all of the conductors 14 of each row. In this manner, voltages Vcc furnished to the conductors 16 in the metal 2 columns are transferred to each of the conductors 12 of the metal 1 layer and each of the voltages Vss furnished to the conductors 17 in the metal 2 row are transferred to each of the conductors 14 of the metal 1 layer. In addition, the conductors 18 and 19 in the additional metal 3 layer are typically positioned parallel to the conductors 12 and 14 and run across the face of the group of cells to provide Vcc and Vss to the conductors of the metal 2 layer. The conductors 18 and 19 are positioned in manner that one metal 3 conductor crosses all of the cells in each row to provide one of the voltages Vcc or Vss to the metal 2 conductors carrying that particular voltage, while the metal 3 conductor in the next adjacent row carries the other of the two voltages to the metal 2 conductors carrying that other voltage.

With more advanced semiconductor processes such as 0.5 micron processes, an additional layer of metallic conductors (metal 4) overlies all of the other metallic layers and furnish Vcc and Vss from the main sources of power on the chip to the conductors of the metal 3 layer. These metal 4 conductors are typically spaced approximately three or four cells apart (or more with small cells) and are parallel to the metal 2 conductors 16 and 17. This grid of power-furnishing conductors is illustrated in FIG. 3. As may be seen, when all of these power carrying conductors are in place covering each of the chips, a substantial amount of the surface of individual cells is covered by this power grid. This has made it very difficult to find room to place the interconnecting conductors on the individual cells in order to make the connections to the nodes N which must be made in order for the larger circuits to function correctly. For example, if a metallic power conductor of the metal 2 layer covers any of the nodes N1, N2, or N3, there is no manner in which a connection may be made to any of those nodes since each is completely surrounded by metal 1 and polysilicon conductors and can be reached only from above, a region covered by a metal 2 power conductor. It would be advantageous to be able to simply reduce the width of the power grid conductors on each of the metal 2 and metal 3 layers and thereby provide more space by which to reach the upper surface of the semiconductor devices. Unfortunately, the width of these conductors is determined by the amount of current which must be furnished to the circuitry and is typically already at a minimum.

The present invention is designed to provide more available space by which the individual cells may be connected to conductors leading to circuitry outside the cells. The first step in accomplishing this is to restrict the placement of the nodes so that external connections may not be made to the devices of a cell in some particular portion which runs parallel to the metal 1 power conductors. This, of course, cannot be accomplished in all portions of the cell, but it is possible to exclude external nodes from small portion of the cell. In one embodiment, the upper portion of cells adjoining and below the upper power rail has been cleared of any external connection nodes. This area is selected because only one metal 3 power conductor need cross any individual cell. Moreover, by clearing an area toward the upper or lower edge of the cells, the metal 2 conductors which join the metal 3 conductors to carry power to the metal 1 power conductors may be restricted to this area (or outside the cell boundaries) and excluded from a substantial portion of the cell area leaving most external connection nodes free. Thus, as a rule, in the design of cells to be placed on the silicon substrate in rectangular groups such as discussed above, the devices are arranged so that external nodes do not fall in this area in the upper portion of the cell adjacent the upper metal 1 power rail. This region may be used for the metal 3 power conductors and the metal 2 power conductors which connect to them. By providing as well as possible that as few as possible external nodes fall in this area, the number of nodes which may be covered by the metal 2 and 3 power rails is reduced.

Next, the position of the metal 1 power conductors is reversed in every other row. This places a power conductor 12 carrying voltage Vcc for an upper row of cells immediately adjacent a conductor 12 from the next adjacent row of cells. Similarly, conductors 14 carrying voltage Vss from adjacent rows are positioned immediately adjacent one another. In fact, the two adjacent conductors carrying each voltage Vcc or Vss may be joined so long as their total width and, thus, current carrying capacity is maintained. This reversing of rows allows the number of metal 3 conductors to be halved. Then, the metal 2 power buses are truncated so that each conductor connects only between metal 1 conductors in two adjacent rows. FIG. 4 illustrates an arrangement in which the metal 2 power conductors are so truncated. In FIG. 4, the same numbers are used to designate the various metallic conductors so that the purpose of each may be more easily understood. As may be seen, truncating the metal 2 conductors provides a substantial amount of additional space on the surface of each of the cells to which connections may be made and limits the area of the cells covered by the metal 2 power conductors. Since the metal 2 conductors connect to metal 1 conductors lying adjacent one another and to metal 3 conductors in an immediately adjacent area, the metal 2 conductors need not cover any significant portion of the cells carrying external nodes. It should be noted that truncating the power conductors in this manner does not reduce the amount of current carried to the metal 1 power conductors since each conductor 12 and 14 is still furnished current from the same number of metal 2 conductors as in prior art arrangements. However, the area covered by the metal 2 power conductors is reduced radically over the cell area covered in prior art arrangements leaving substantially more area for connecting to nodes from outside the cell.

Finally, in all prior art devices, the position of the metal 4 conductors with respect to the metal 2 conductors has been essentially fortuitous. The amount of current which needed to be carded by each set of conductors was known, and an appropriate number of conductors of each type were provided and spaced without attention being paid to the positioning with regard to the other set of conductors. FIG. 5 illustrates the current paths through the metal 4 power conductor into a metal 3 power conductor and then through four metal 2 power conductors to the metal 1 power rails. The result of this fortuitous positioning has been that each metal 4 power conductor typically provides sufficient current to furnish the current for four individual metal two power conductors. As may be seen in FIG. 5, this means in many cases that the metal 3 power conductors must be sufficiently wide to carry current from the metal 4 power conductor to a pair of metal 2 power conductors positioned to each side of the metal 4 power, conductor. Since the arrangement of the metal 2 and metal 4 conductors with respect to one another has not heretofore been planned but fortuitous, the metal 3 power conductors must each be at least wide enough to carry current for two pairs of two metal 2 power conductors. In other specific arrangements, different mounts of current would be carried, but in each case, the metal 3 power conductors has to be wide enough to carry current in each direction from the metal 4 power conductor for at least one-half of the average number of metal 2 power conductors associated with each metal 4 conductor. Thus, this spacing of the metal 4 and metal 2 power conductors has inadvertently determined the width of the metal 3 power conductors in prior art arrangement.

By spacing the metal 2 and metal 4 power conductors carefully so that two of the metal 2 conductors fall under the metal 4 power conductor, one under either edge thereof, while two additional metal 2 power conductors are positioned in the interstices between adjacent metal 4 power conductors, the current which the metal 3 power conductor needs to carry in each direction from the metal 4 power conductor may be essentially reduced to one half that necessary in prior art arrangements. As may be seen in FIG. 6 which illustrates only a single metal 4 power conductor carrying current for only one of the voltages necessary, the two metal 2 conductors positioned under the metal 4 conductor are positioned so that their center lines lie approximately one-fourth of the width of the metal 4 from the edge of the metal 4 conductor. This provides essentially equivalent current carrying paths through the metal 4 conductor on either side of the metal 2 conductors. Thus, the metal 2 conductors which lie under the edge of the metal 4 conductor may be considered to be connected to the metal 4 conductor through the metal 3 conductor which is strapped to the metal 4 conductor and to carry current furnished from the central portion of the metal 4 power conductor without depending on the width of the metal 3 conductor. On the other hand, the current carried by the metal 2 conductors in the interstices between the metal 4 conductors essentially flows along the outer edges of the metal 4 conductors and into the metal 3 conductors through vias at the edge of the metal 4 conductor. Since the metal 3 conductor extending outward from the metal 4 conductor need not carry current for the metal 2 conductors under the metal 4 conductor, this allows the width of the metal 3 power conductors to be essentially halved. Halving the width of the metal 3 conductor reduces the amount by which the metal 2 power conductors need extend over the cells thereby uncovering a substantial amount of additional chip area to which external node connections may be made.

Of course, it will be recognized that if fewer metal 4 power conductors are necessary with respect to metal 2 conductors, then a similar result may be produced by positioning two of the metal 2 power conductors under opposite edges of the metal 4 power conductors since the two metal two conductors positioned under the metal 4 conductor carry current essentially directly from the metal 4 power conductor without the need for that current to be carried by the metal 3 conductor. Thus, in an arrangement in which four metal 2 power conductors lie in the interstices and separate each metal 4 power conductor from the next metal 4 power conductor carrying the same voltage, the current through the metal 3 power conductor need be only two-thirds of that used in prior art if the metal 2 conductors covered by the metal 4 conductor are moved further toward the center of the metal 4 conductor; and the metal 3 conductors may be appropriately narrowed.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A power bus for semiconductor cells comprising:

a plurality of parallel first and second metal 1 conductors defining positions of a plurality of rows of cells, the first and second metal 1 conductors in adjacent rows being at opposite edges of the cells;

a plurality of metal 3 conductors each positioned adjacent an edge of a row of cells next to a pair of adjacent first or second metal 1 conductors;

a plurality of metal 2 conductors each connecting a metal 3 conductor to each one of the pair of adjacent metal 1 power conductors; and a plurality of evenly spaced metal 4 conductors, alternate ones of which connect to each metal 3 conductor joined by a metal 2 conductor to each first metal 1 conductor, and to each metal 3 conductor joined by a metal 2 conductor to each second metal 1 conductor, the metal 4 conductors each covering a pair of metal 2 conductors to which it is connected by a metal 3 conductor.

2. A power bus as claimed in claim 1 in which the metal 2 conductors covered by a metal 4 conductor are positioned approximately one-fourth of the width of the metal 4 conductors from the edge thereof.

3. A power bus as claimed in claim 1 in which the metal 2 conductors extend only between adjacent first or second metal 1 conductors and an adjacent metal 3 conductor.

4. A power bus as claimed in claim 1 in which a plurality of metal 2 conductors extend between adjacent first or second metal 1 conductors and an adjacent metal 3 conductor in interstices between metal 4 conductors.

5. A power bus as claimed in claim 1 in which ones of the metal 3 conductors which are positioned over cells are positioned over areas containing no external nodes.

6. A power bus structure for a plurality of cells positioned in a rectangular pattern in a plurality of rows on a substrate comprising:

a pair of metal 1 conductors parallel to one another at opposite edges of the cells of each row for carrying first and second voltages, the position of the metal 1 conductors being reversed in adjacent rows;

a plurality of metal 3 conductors each being parallel to a pair of metal 1 conductors in cells of adjacent rows for carrying one of the voltages near the edge of cells of a row;

a plurality of metal 2 conductors perpendicular to and connecting a pair of metal 1 conductors in cells of adjacent rows and a metal 3 conductor for carrying one of the voltages; and a plurality of metal 4 conductors spaced at regular intervals and perpendicular to the rows of cells, each metal 4 conductor being joined to metal 3 conductors for carrying one of the voltages and being positioned over a pair of the metal 2 conductors connected to the metal 3 conductor.

7. A power bus structure as claimed in claim 6 in which a metal 4 conductor is positioned over metal 2 conductors which lie at approximately one-fourth of the width of the metal 4 conductors from the edge thereof.

8. A power bus as claimed in claim 6 in which the metal 2 conductors extend only between adjacent metal 1 conductors and an adjacent metal 3 conductor carrying one of the voltages.

9. A power bus as claimed in claim 6 in which a plurality of metal 2 conductors extend between adjacent metal 1 conductors and an adjacent metal 3 conductor carrying one of the voltages in interstices between metal 4 conductors.

10. A power bus as claimed in claim 6 in which ones of the metal 3 conductors which are positioned over cells are positioned over areas containing no nodes for external connection.

11. A power bus for semiconductor cells comprising:

a plurality of parallel first and second means conducting current in a metal 1 layer defining positions of a plurality of rows of cells, the first and second means conducting current in a metal 1 layer in adjacent rows being at opposite edges of the cells;

a plurality of means conducting current in a metal 3 layer each positioned adjacent an edge of a row of cells next to a pair of adjacent first or second means conducting current in a metal 1 layer;

a plurality of means conducting current in a metal 2 layer each connecting a means conducting current in a metal 3 layer to each one of the pair of adjacent means conducting current in a metal 1 layer; and a plurality of evenly spaced means conducting current in a metal 4 layer, alternate ones of which connect to each means conducting current in a metal 3 layer joined by a means conducting current in a metal 2 layer to each first means conducting current in a metal 1 layer, and to each means conducting current in a metal 3 layer metal joined by a means conducting current in a metal 2 layer to each means conducting current in a second means conducting current in a metal 1 layer, each means conducting current in a metal 4 layer covering a pair of means conducting current in a metal 2 layer to which it is connected by a means conducting current in a metal 3 layer.

12. A power bus as claimed in claim 11 in which the means conducting current in a metal 2 layer covered by a means conducting current in a metal 4 layer are positioned approximately one-fourth of the width of the means conducting current in a metal 4 layer from the edge thereof.

13. A power bus as claimed in claim 11 in which the means conducting current in a metal 2 layer extend only between adjacent first or second means conducting current in a metal 1 layer and an adjacent means conducting current in a metal 3 layer.

14. A power bus as claimed in claim 11 in which a plurality of means conducting current in a metal 2 layer extend between adjacent first or second means conducting current in a metal 1 layer and an adjacent means conducting current in a metal 3 layer in interstices between means conducting current in metal 4 layers.

15. A power bus as claimed in claim 11 in which ones of the means conducting current in a metal 3 layer which are positioned over cells are positioned over areas containing no external nodes.

16. A power bus structure for a plurality of cells positioned in a rectangular pattern in a plurality of rows on a substrate comprising:

a pair of metal 1 means parallel to one another at opposite edges of the cells of each row for carrying first and second voltages, the position of the metal 1 means being reversed in adjacent rows;

a plurality of metal 3 means each being parallel to a pair of metal i means in cells of adjacent rows for carrying one of the voltages near the edge of cells of a row;

a plurality of metal 2 means perpendicular to and connecting to a pair of metal 1 means in cells of adjacent rows and to a metal 3 means for carrying one of the voltages; and a plurality of metal 4 means spaced at regular intervals and perpendicular to the rows of cells, each metal 4 means being joined to metal 3 means for carrying one of the voltages and being positioned over a pair of the metal 2 means connected to the metal 3 means.

17. A power bus structure as claimed in claim 16 in which a metal 4 means is positioned over metal 2 means which lie at approximately one-fourth of the width of the metal 4 means from the edge thereof.

18. A power bus as claimed in claim 16 in which the metal 2 means extend only between adjacent metal 1 means and an adjacent metal 3 means carrying one of the voltages.

19. A power bus as claimed in claim 16 in which a plurality of metal 2 conductors extend between adjacent metal 1 means and an adjacent metal 3 means carrying one of the voltages in interstices between metal 4 means.

20. A power bus as claimed in claim 16 in which ones of the metal 3 means which are positioned over cells are positioned over areas containing no nodes for external connection.

* * * * *